(12) United States Patent
Aoyama et al.

(10) Patent No.: US 9,059,303 B2
(45) Date of Patent: Jun. 16, 2015

(54) NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventors: Kenji Aoyama, Mie-ken (JP); Tatsuya Okamoto, Mie-ken (JP); Hiroki Yamashita, Mie-ken (JP); Masanari Hattori, Mie-ken (JP)

(73) Assignee: Kabushiki Kaisha Toshiba, Minatu-ku (JP)

( * ) Notice: Subject to any disclaimer, the term of this patent is extended or adjusted under 35 U.S.C. 154(b) by 0 days.

(21) Appl. No.: 14/163,191

(22) Filed: Jan. 24, 2014

(65) Prior Publication Data

US 2015/0069495 A1 Mar. 12, 2015

Related U.S. Application Data

(60) Provisional application No. 61/876,283, filed on Sep. 11, 2013.

(51) Int. Cl.
*H01L 29/792* (2006.01)
*H01L 21/76* (2006.01)

(52) U.S. Cl.
CPC .............. *H01L 29/792* (2013.01); *H01L 21/76* (2013.01)

(58) Field of Classification Search
USPC ........................................................ 257/324
See application file for complete search history.

(56) References Cited

U.S. PATENT DOCUMENTS

| 7,833,912 | B2 | 11/2010 | Kobayashi et al. |
| 8,093,149 | B2 | 1/2012 | Tomita |
| 8,289,782 | B2 | 10/2012 | Izumida et al. |
| 2007/0111433 | A1 | 5/2007 | Hirasawa et al. |
| 2007/0254463 | A1 | 11/2007 | Kobayashi et al. |
| 2009/0032847 | A1 | 2/2009 | Tomita |

FOREIGN PATENT DOCUMENTS

| JP | 2012-044059 | * 1/2012 | .......... H01L 21/8247 |
| JP | 2012-44059 | 3/2012 | |

* cited by examiner

*Primary Examiner* — Zandra Smith
*Assistant Examiner* — Lawrence Tynes, Jr.
(74) *Attorney, Agent, or Firm* — Oblon, McClelland, Maier & Neustadt, L.L.P.

(57) ABSTRACT

According to one embodiment, a nonvolatile semiconductor memory device includes: a first stacked body having a gate insulating film, a first charge storage layer, a first insulating film, a second charge storage layer, and a second insulating film, a second element isolation region, a bottom and at least part of a side portion of the second element isolation region being in contact with the semiconductor substrate in the peripheral portion; and a second stacked body, a third insulating film, a first layer, a fourth insulating film, a second layer, and the second insulating film are stacked in this order from the semiconductor substrate side between the semiconductor substrate and the control gate electrode in the second stacked body in the peripheral portion, a side portion of the second stacked body being covered with the second insulating film.

17 Claims, 8 Drawing Sheets

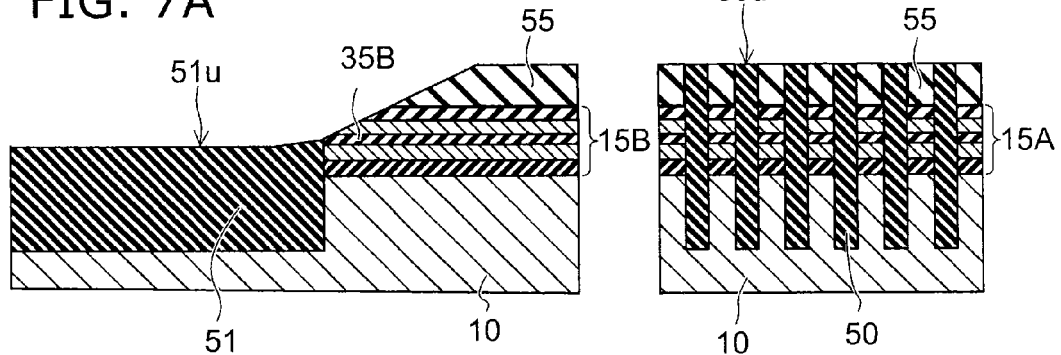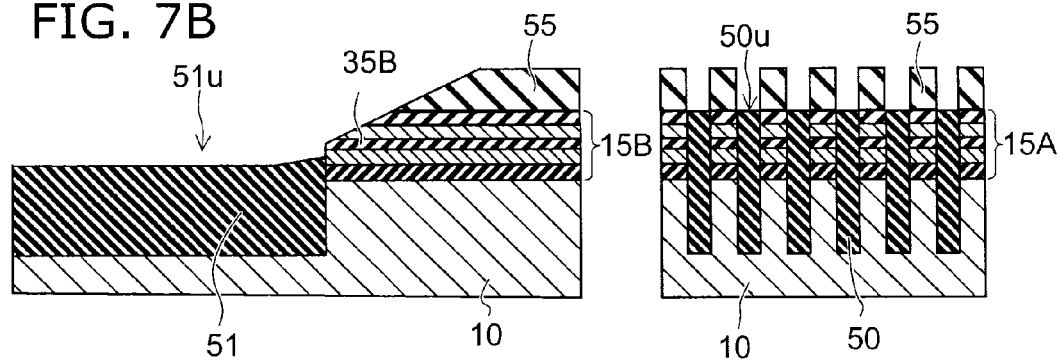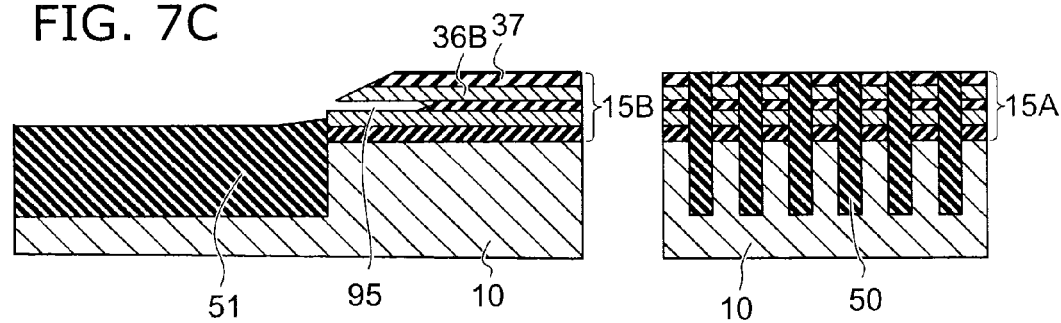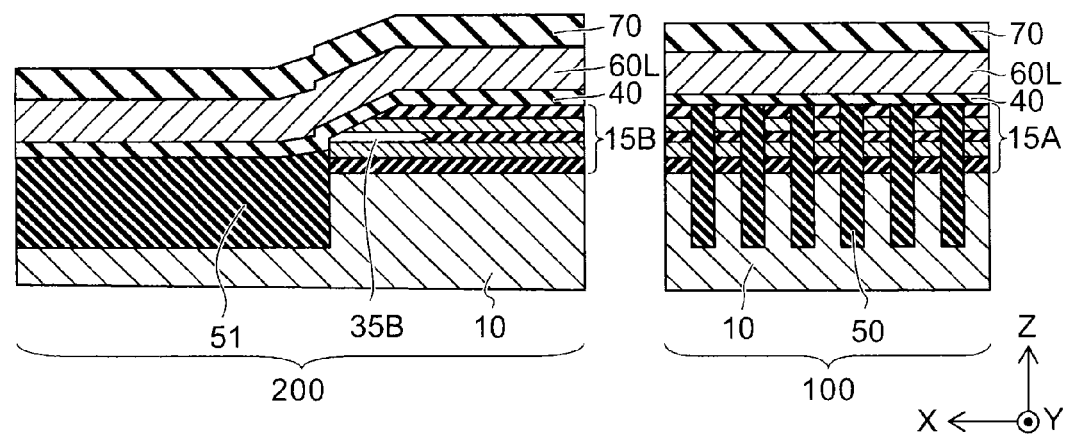

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/876,283, filed on Sep. 11, 2013; the entire contents of which are incorporated herein by reference.

FIELD

Embodiments described herein relate generally to a nonvolatile semiconductor memory device and a method for manufacturing the same.

BACKGROUND

In the manufacturing process of a nonvolatile semiconductor memory device, the chemical mechanical polishing (CMP) method may be used in order to form an element isolation region. There are element isolation regions with a wide width and a narrow width. If an element isolation region with a particularly wide width is processed by CMP, an erosion effect in which the surface of the element isolation region is recessed may occur. The erosion effect may influence other layers formed at a periphery of the element isolation region.

BRIEF DESCRIPTION OF THE DRAWINGS

FIG. 7A to FIG. 7D are schematic cross-sectional views showing a method for manufacturing a nonvolatile semiconductor memory device according to a reference example.

DETAILED DESCRIPTION

Figure 1:
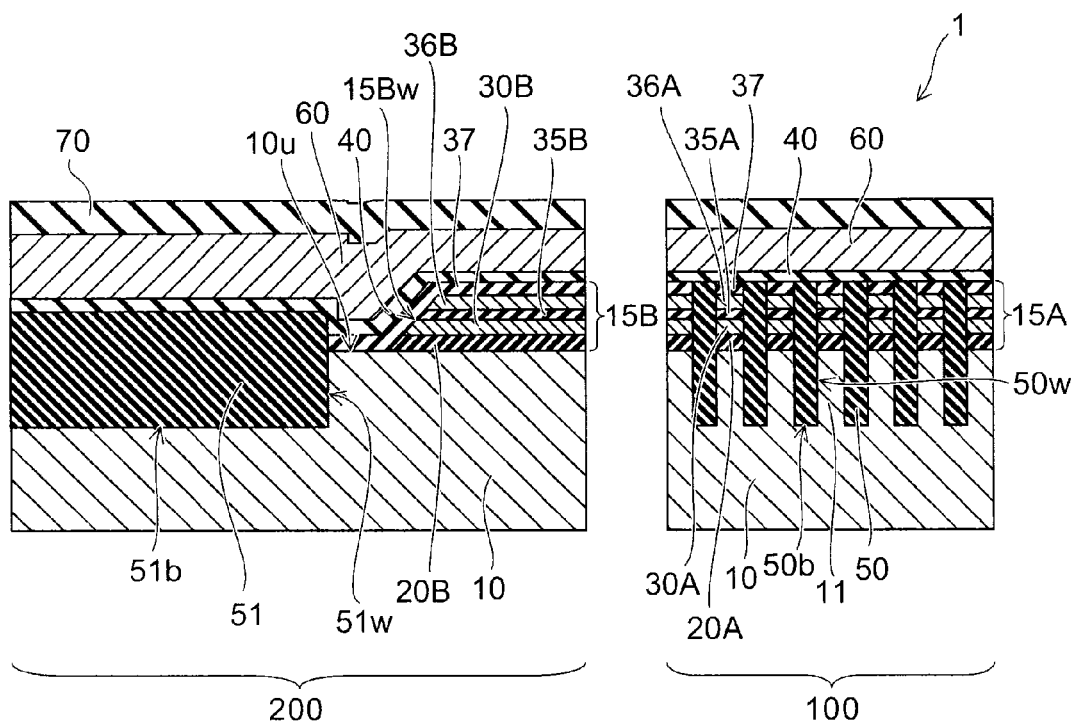
FIG. 1 is a schematic cross-sectional view of a nonvolatile semiconductor memory device according to the embodiment.

In general, according to one embodiment, a nonvolatile semiconductor memory device includes: a semiconductor substrate provided in a memory cell portion and in a peripheral portion at a periphery of the memory cell portion; a control gate electrode provided on an upper side of the semiconductor substrate and the control gate electrode extending in a first direction; a first element isolation region, a bottom and part of a side portion of the first element isolation region being in contact with the semiconductor substrate, the first element isolation region extending in a second direction crossing the first direction, and the first element isolation region separating a surface layer of the semiconductor substrate into a plurality of semiconductor regions in the memory cell portion; a first stacked body, a gate insulating film, a first charge storage layer, a first insulating film, a second charge storage layer, and a second insulating film are stacked in this order from the semiconductor region side in the first stacked body, the first stacked body being positioned in a position, each of the plurality of semiconductor regions and the control gate electrode cross each other in the position in the memory cell portion; a second element isolation region, a bottom and at least part of a side portion of the second element isolation region being in contact with the semiconductor substrate in the peripheral portion; and a second stacked body, a third insulating film, a first layer, a fourth insulating film, a second layer, and the second insulating film are stacked in this order from the semiconductor substrate side between the semiconductor substrate and the control gate electrode in the second stacked body in the peripheral portion, a side portion of the second stacked body being covered with the second insulating film.

Hereinbelow, embodiments are described with reference to the drawings. In the following description, identical components are marked with the same reference numerals, and a description of components once described is omitted as appropriate.

First Embodiment

FIG. 1 is a schematic cross-sectional view of a nonvolatile semiconductor memory device according to the embodiment.

The right side of FIG. 1 illustrates a memory cell portion 100, and the left side illustrates a peripheral portion 200 provided at a periphery of the memory cell portion 100.

A nonvolatile semiconductor memory device 1 according to the embodiment includes the memory cell portion 100 including NAND memory cells and the peripheral portion 200 provided at a periphery of the memory cell portion 100.

In the nonvolatile semiconductor memory device 1, a semiconductor substrate 10 is provided in the memory cell portion 100 and the peripheral portion 200. A control gate electrode 60 extending in the X-direction (a first direction) is provided on the upper side of the semiconductor substrate 10 and on the upper side of an element isolation region 51. The control gate electrode 60 functions as a gate electrode for controlling a transistor. The control gate electrode 60 may be referred to as a word line (WL).

In the memory cell portion 100, element isolation regions 50 separating the surface layer of the semiconductor substrate 10 into a plurality of semiconductor regions 11 are provided. The semiconductor region 11 is an active area that the transistor of the nonvolatile semiconductor memory device 1 occupies. The bottom 50b of the element isolation region 50 and part of the side portion 50w thereof are in contact with the semiconductor substrate 10. The element isolation region 50 extends in the Y-direction (a second direction) crossing (for example, orthogonal to) the X-direction.

In the memory cell portion 100, in a position where each of the plurality of semiconductor regions 11 and the control gate electrode 60 cross each other, a gate insulating film 20A, a charge storage layer 30A (a first charge storage layer), an IFD (inter-floating gate dielectric) film 35A (a first insulating film), a charge storage layer 36A (a second charge storage layer) as a CT (charge trap) film or the like, and an insulating film 37 (a second insulating film) are stacked in this order from the semiconductor region 11 side. This stacked body 15A (a first stacked body) in the memory cell portion 100 may be referred to as a memory cell.

The gate insulating film 20A in the memory cell functions as a tunnel insulating film that allows a charge (e.g. electrons) to tunnel between the semiconductor region 11 and the charge storage layer 30A. The charge storage layer 30A can store a charge that has tunneled from the semiconductor region 11 via the gate insulating film 20A. The charge storage layer 36A can store a charge that has tunneled from the charge storage layer 30A via the IFD film 35A. The IFD film 35A functions as a tunnel insulating film that allows a charge (e.g. electrons) to tunnel between the charge storage layer 30A and the charge storage layer 36A and as a reaction prevention film of the charge storage layer 30A and the charge storage layer 36A.

In the peripheral portion 200, an element isolation region 51 is provided in the semiconductor substrate 10. The bottom 51b of the element isolation region 51 and at least part of the side portion 51w are in contact with the semiconductor substrate 10. The element isolation region 51 is an element isolation region for partitioning the memory cell portion 100 from a peripheral circuit, for example.

In the peripheral portion 200, a stacked body 15B (a second stacked body) in which an insulating film 20B (a third insulating film), a layer 30B, an insulating film 35B (a fourth insulating film), a layer 36B, and the insulating film 37 are stacked in this order from the semiconductor substrate 10 side is provided between the semiconductor substrate 10 and the control gate electrode 60. Here, the material of the insulating film 20B is the same as the material of the gate insulating film 20A. The material of the layer 30B is the same as the material of the charge storage layer 30A. The material of the insulating film 35B is the same as the material of the IFD film 35A. The material of the layer 36B is the same as the material of the charge storage layer 36A.

Each of the insulating film 20B, the layer 30B, the insulating film 35B, and the layer 36B in the stacked body 15B is not in contact with the element isolation region 51.

In the peripheral portion 200, the insulating film 37 extends up to the side portion 15Bw of the stacked body 15B and the surface 10u of the semiconductor substrate 10 between the stacked body 15B and the element isolation region 51. The insulating film 37 is in contact with the element isolation region 51.

In the memory cell portion 100 and the peripheral portion 200, a block insulating film 40 (a fifth insulating film) is provided between the insulating film 37 and the element isolation region 51, and the control gate electrode 60. An insulating film 70 as a cap film is provided on the control gate electrode 60.

The material of the semiconductor substrate 10 (or the semiconductor region 11) is a semiconductor crystal doped with an impurity, for example. Silicon (Si) is given as the semiconductor, for example.

The material of the gate insulating film 20A is silicon oxide ($SiO_x$), silicon oxynitride ($SiON_x$), silicon nitride ($SiN_x$), or the like, for example.

The material of the charge storage layer 30A may be a semiconductor material such as Si and a Si-based compound, a material other than this (e.g. a metal or an insulating film), or a stacked film of these, for example. For example, the material of the charge storage layer 30A is a semiconductor containing an n-type (second conductivity type) impurity, a metal, a metal compound, or the like. As the material, for example, amorphous silicon (a-Si), polysilicon (poly-Si), silicon germanium (SiGe), silicon nitride ($Si_xN_y$), hafnium oxide ($HfO_x$), and the like are given.

The material of the IFD film 35A is silicon nitride ($Si_xN_y$), silicon oxide ($SiO_x$), aluminum oxide ($AlO_x$), hafnium oxide ($HfO_x$), or the like, for example.

The material of the charge storage layer 36A is hafnium oxide ($HfO_x$), for example. Other than this, the charger storage layer 36A may be a semiconductor material such as Si and a Si-based compound, a material other than this (e.g. a metal or an insulating film), or a stacked film of these, for example. For example, the material of the charge storage layer 36A is a semiconductor containing an n-type (second conductivity type) impurity, a metal, a metal compound, or the like. As the material, for example, amorphous silicon (a-Si), polysilicon (poly-Si), silicon germanium (SiGe), silicon nitride ($Si_xN_y$), and the like are given.

The material of the insulating film 37 is silicon oxide ($SiO_x$), for example.

The material of the block insulating film 40 is hafnium oxide ($HfO_x$), silicon nitride ($SiN_x$), silicon nitride ($SiN_x$), silicon oxide ($SiO_x$), aluminum oxide ($AlO_x$), zirconium oxide ($ZrO_x$), lanthanum oxide ($LaO_x$), or the like, for example.

The material of the control gate electrode 60 is polysilicon, a metal such as tungsten, or a metal silicide, for example.

The material of the element isolation regions 50 and 51 is silicon oxide ($SiO_x$), for example.

The manufacturing process of the nonvolatile semiconductor memory device 1 will now be described.

FIG. 2A to FIG. 5B are schematic cross-sectional views showing a method for manufacturing a nonvolatile semiconductor memory device according to the embodiment.

Figure 6A:
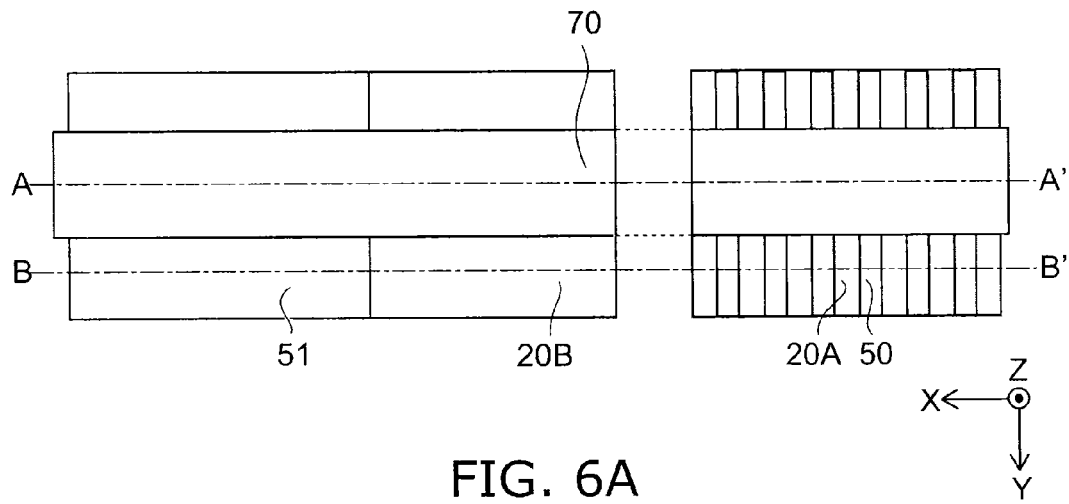
FIG. 6A is a schematic plan view showing the method for manufacturing a nonvolatile semiconductor memory device according to the embodiment.
Figure 6B:
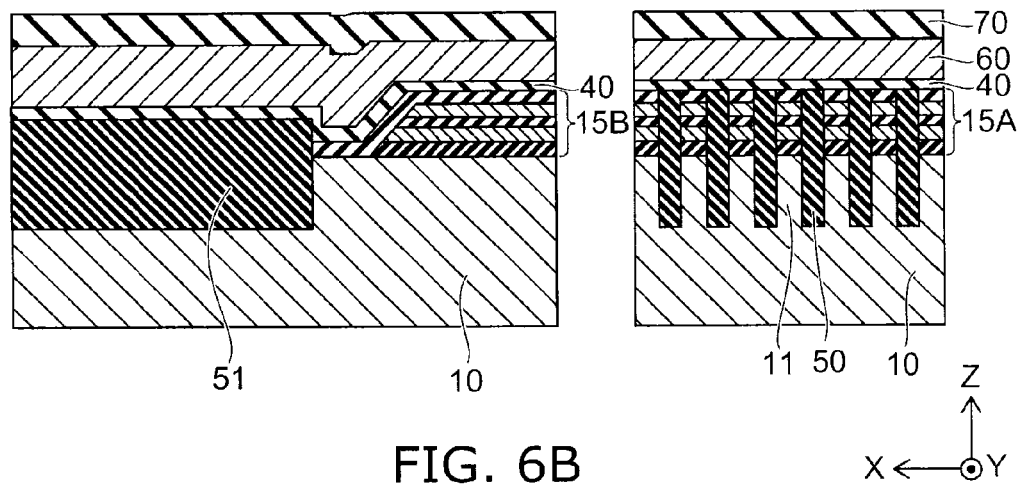
FIGS. 6B and 6C are schematic cross-sectional views showing the method for manufacturing a nonvolatile semiconductor memory device according to the embodiment.
Figure 6C:
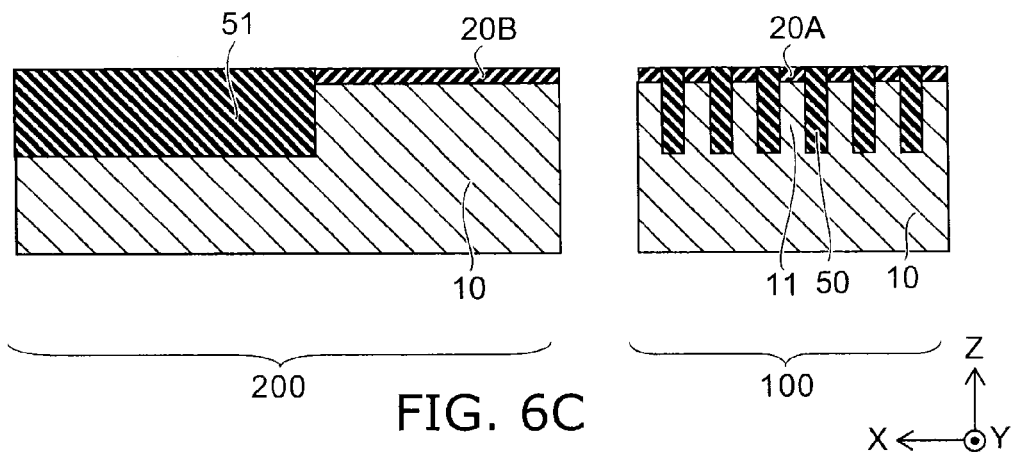

FIG. 6A is a schematic plan view showing the method for manufacturing a nonvolatile semiconductor memory device according to the embodiment, and FIGS. 6B and 6C are schematic cross-sectional views showing the method for manufacturing a nonvolatile semiconductor memory device according to the embodiment.

Here, FIG. 6B shows a cross-sectional view taken along line A-A' of FIG. 6A, and FIG. 6C shows a cross section taken along line B-B' of FIG. 6A.

The right side of each of FIG. 2A to FIG. 6C illustrates the formation process of the memory cell portion 100, and the left side illustrates the formation process of the peripheral portion 200.

Figure 2A:
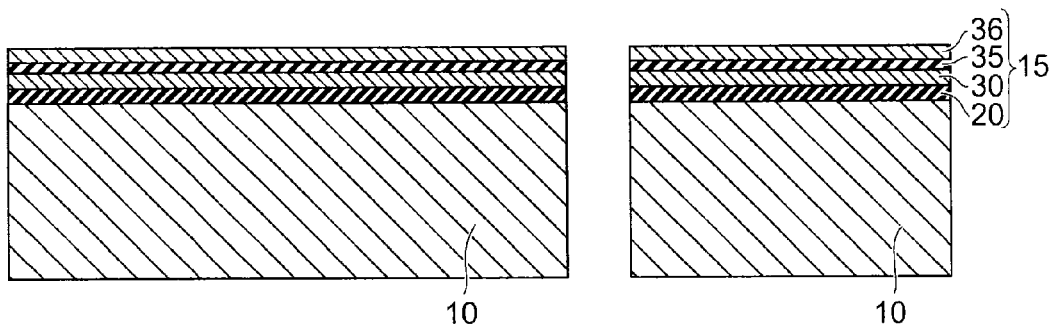
FIG. 2A to FIG. 5B are schematic cross-sectional views showing a method for manufacturing a nonvolatile semiconductor memory device according to the embodiment.

As shown in FIG. 2A, a stacked body 15 is formed on the semiconductor substrate 10. The stacked body 15 includes an gate insulating film 20, a charge storage layer 30, an IFD film 35, and a charge storage layer 36.

Figure 2B:
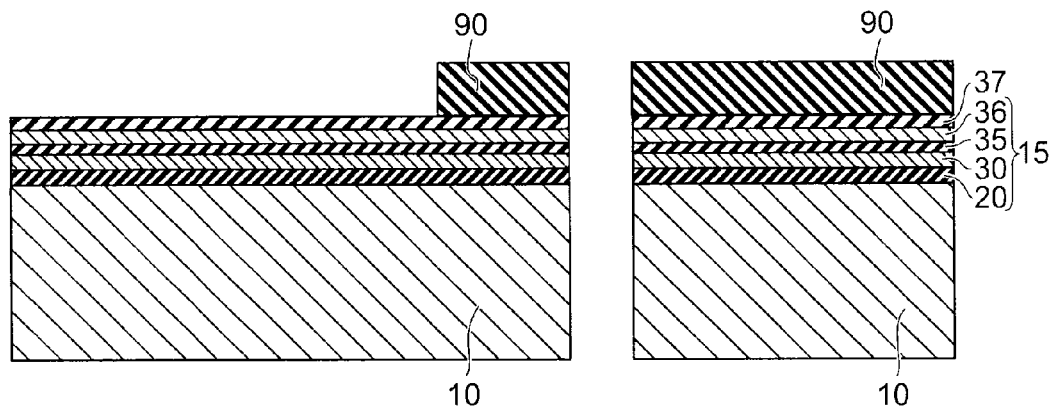

Next, as shown in FIG. 2B, the insulating film 37 is formed on the stacked body 15.

Subsequently, a mask layer 90 (a first mask layer) that covers the stacked body 15 in the memory cell portion 100 and exposes part of the stacked body 15 in the peripheral portion 200 is formed.

Figure 2C:
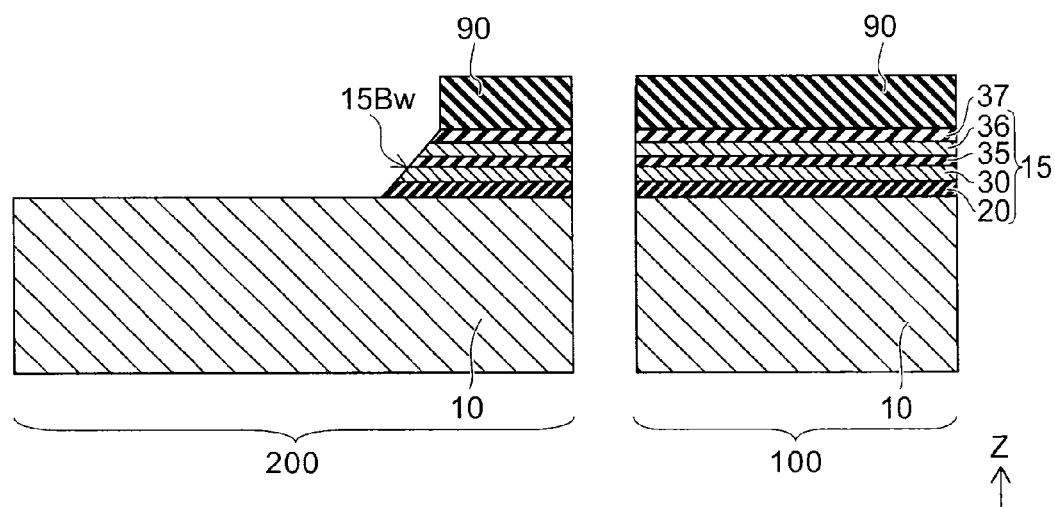

Next, as shown in FIG. 2C, in the peripheral portion 200, the stacked body 15 exposed from the mask layer 90 is etched (for example, by RIE (reactive ion etching)) to expose the semiconductor substrate 10 from the stacked body 15. In the peripheral portion 200, the side portion 15Bw of the stacked body 15 is exposed by the RIE. After that, the mask layer 90 is removed.

Figure 3A:
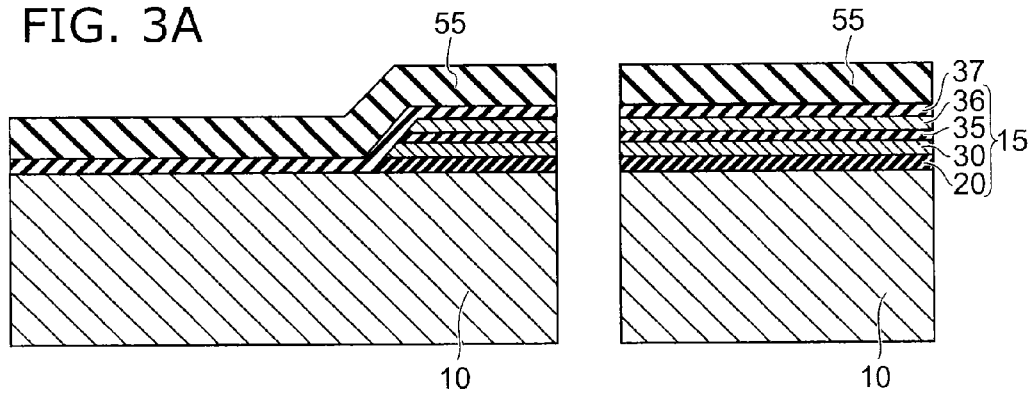

Next, as shown in FIG. 3A, in the memory cell portion 100, the insulating film 37 is formed to be superposed on the stacked body 15. In the peripheral portion 200, the insulating film 37 is formed on the exposed semiconductor substrate 10, on the stacked body 15, and on the side portion 15Bw of the stacked body 15.

Subsequently, in the memory cell portion 100 and the peripheral portion 200, a stopper film 55 functioning as a stopper film in the CMP processing described later is formed on the insulating film 37. The material of the stopper film 55 is the same as the IFD film 35, and is silicon nitride ($Si_xN_y$), for example.

Figure 3B:
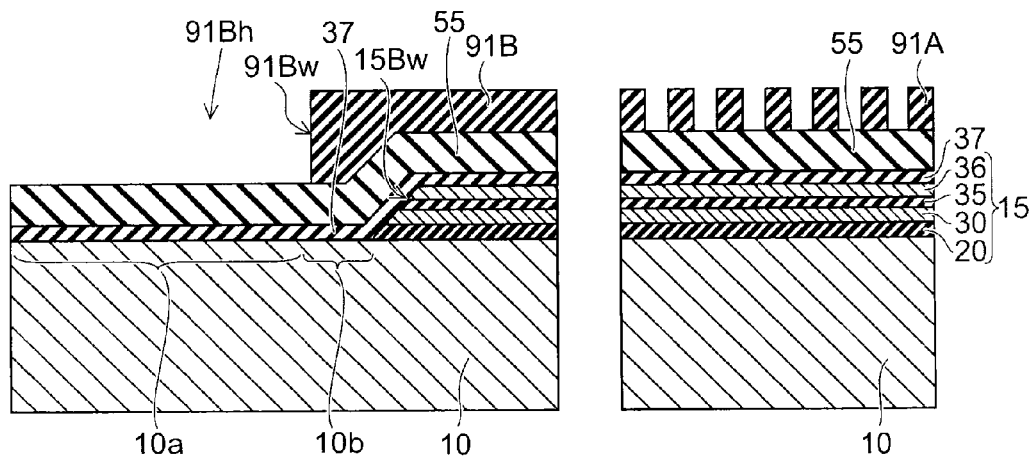

Next, as shown in FIG. 3B, in the memory cell portion 100, a mask layer 91A (a second mask layer) extending in the Y-direction and aligned in the X-direction crossing the Y-direction is formed on the stopper film 55.

In the peripheral portion 200, a mask layer 91B (a third mask layer) having an opening that exposes the stopper film 55 is formed. The side wall 91Bw of the opening 91Bh of the mask layer 91B is located further to the outside of the stacked body 15 than the side portion 15Bw of the stacked body 15. In other words, the mask layer 91B in the peripheral portion 200 is formed above the stacked body 15, the side portion 15Bw of the stacked body 15, and a partial region 10b of the semiconductor substrate 10 continuing from the side portion 15Bw of the stacked body 15.

Figure 3C:
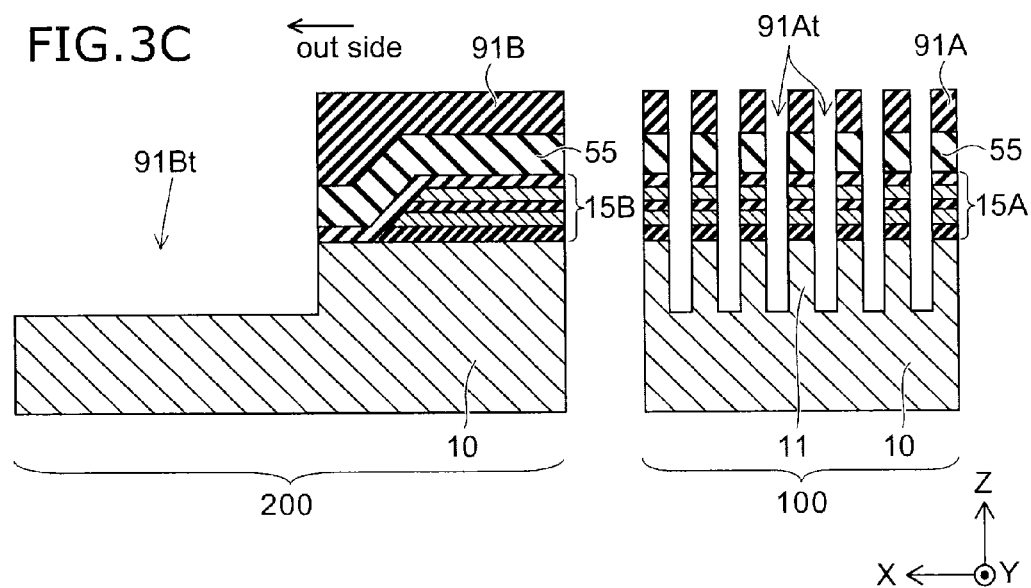

Next, as shown in FIG. 3C, in the memory cell portion 100, the stopper film 55 exposed from the mask layer 91A, the insulating film 37 provided under this stopper layer 55, the stacked body 15 under this insulating film 37, and the semiconductor substrate 10 under this stacked body 15 are etched by RIE. Thereby, trenches 91At (first trenches) extending in the Y-direction and aligned in the X-direction are formed on the lower side of the opening of the mask layer 91A.

By the formation of the trenches 91At, in the memory cell portion 100, the surface layer of the semiconductor substrate 10 is divided in the X-direction to form semiconductor regions 11. Furthermore, the stacked body 15 is divided in the X-direction. The stacked body after the stacked body 15 is divided in the X-direction, including the insulating film 37, is referred to as the stacked body 15A.

In the peripheral portion 200, the stopper film 55 exposed from the mask layer 91B, the insulating film 37 under this stopper film 55, and the semiconductor substrate 10 under this insulating film 37 are etched by RIE. Thereby, a trench 91Bt (a second trench) is formed on the lower side of the opening of the mask layer 91B.

The stacked body after the trench 91Bt is formed, including the insulating film 37, is referred to as the stacked body 15B. After that, the mask layers 91A and 91B are removed.

Figure 4A:
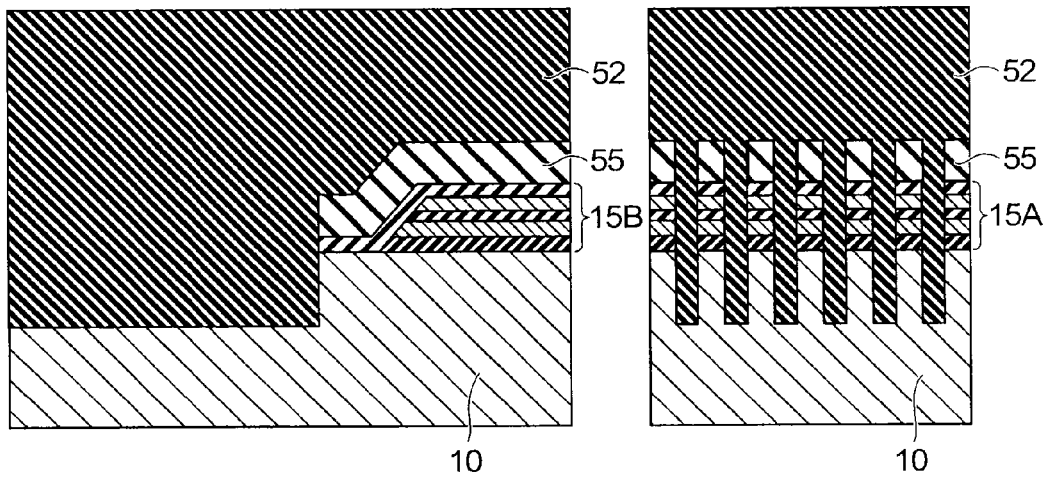

Next, as shown in FIG. 4A, an element isolation layer 52 is formed in the trench 91At, in the trench 91Bt, and on the stopper film 55.

Figure 4B:
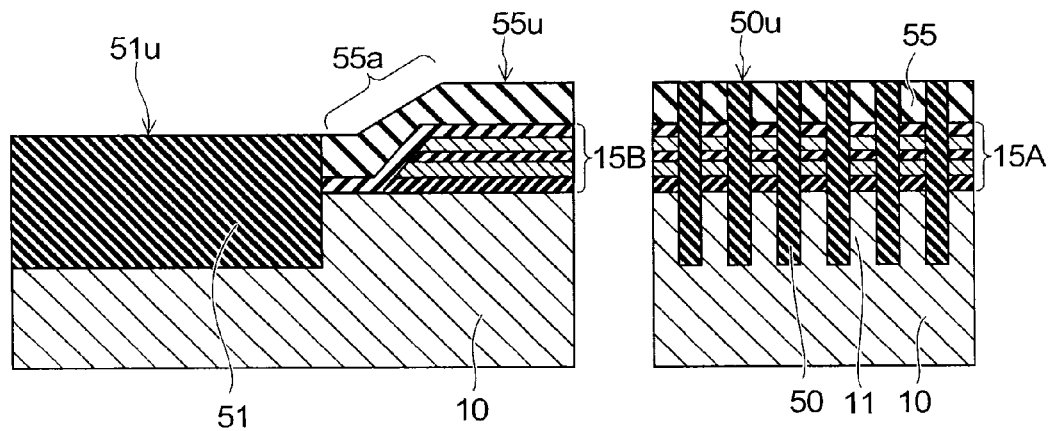

Next, as shown in FIG. 4B, the chemical mechanical polishing (CMP) method is performed on the surface of the element isolation layer 52 in the memory cell portion 100 and the peripheral portion 200. For example, the surface of the element isolation layer 52 is lowered by the chemical mechanical polishing method until the stopper film 55 is exposed. Thereby, the element isolation region 50 is formed in the trench 91At, and the element isolation region 51 is formed in the trench 91Bt.

Here, the width in the X-direction of the element isolation region 51 is wider than the width in the X-direction of the element isolation region 50. Therefore, the erosion effect of chemical mechanical polishing occurs in the element isolation region 51, and the surface 51u of the element isolation region 51 becomes lower than the upper surface 55u of the stopper film 55. Furthermore, also a region 55a of the stopper film 55 at a periphery of the element isolation region 51 is influenced by the erosion effect, and the surface of the region 55a is slightly polished.

Figure 4C:
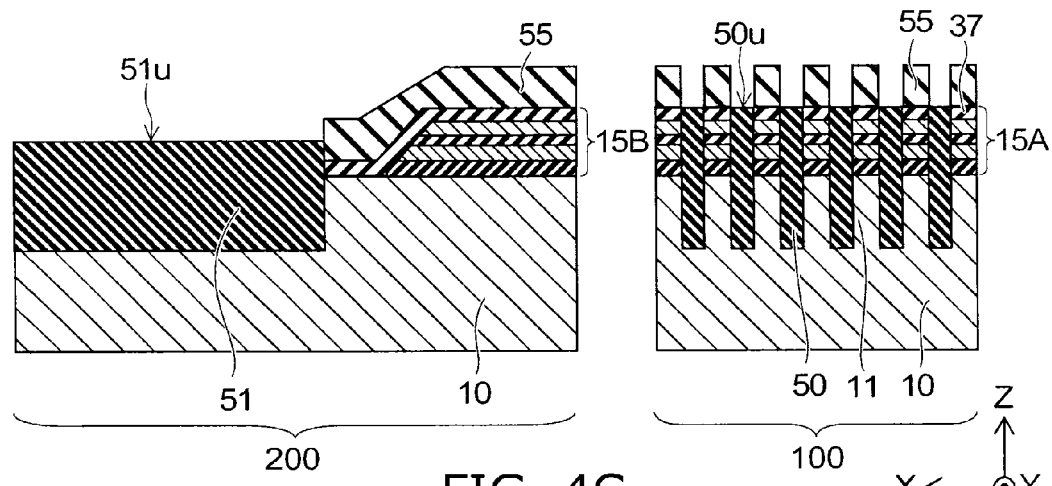

Subsequently, in the memory cell portion 100, the surface 50u of the element isolation region 50 is etched back by RIE. FIG. 4C shows the state after the etchback. Thereby, the height of the surface 50u of the element isolation region 50 becomes the same as the height of the stacked body 15A.

In the peripheral portion 200, since the material of the element isolation region 51 is the same as the material of the element isolation region 50, also the surface 51u of the element isolation region 51 is etched back.

Figure 5A:
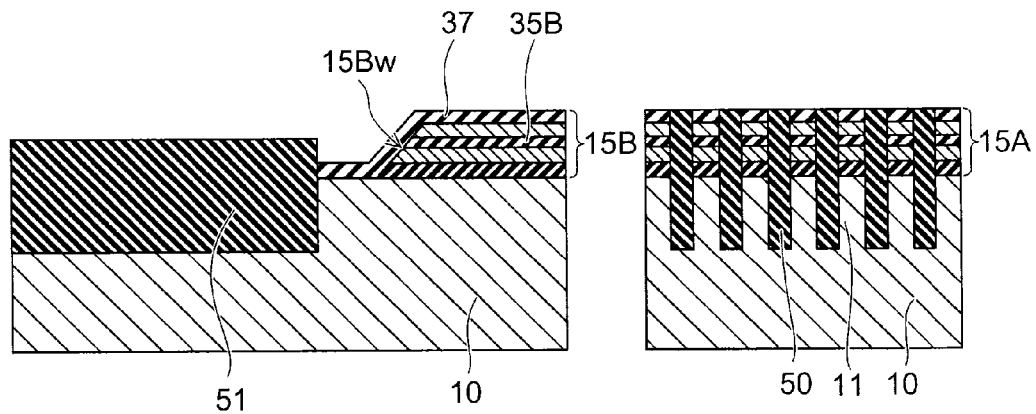

Next, as shown in FIG. 5A, in the memory cell portion 100 and the peripheral portion 200, the stopper film 55 is removed by wet etching.

Here, the stopper film 55 contains silicon nitride, and the insulating film 37 existing under the stopper film 55 contains silicon oxide different from silicon nitride. Therefore, the insulating film 37 is not etched by the etchant for the stopper film 55. In other words, in the wet etching, the etching rate of the stopper film 55 is higher than the etching rate of the insulating film 37.

The insulating film 37 is the uppermost layer of the stacked body 15B, and further covers the side portion 15Bw of the stacked body 15B. Therefore, even if the insulating film 35B contains the same material as the stopper film 55, the insulating film 35B is protected by the insulating film 37 and is not etched.

Figure 5B:
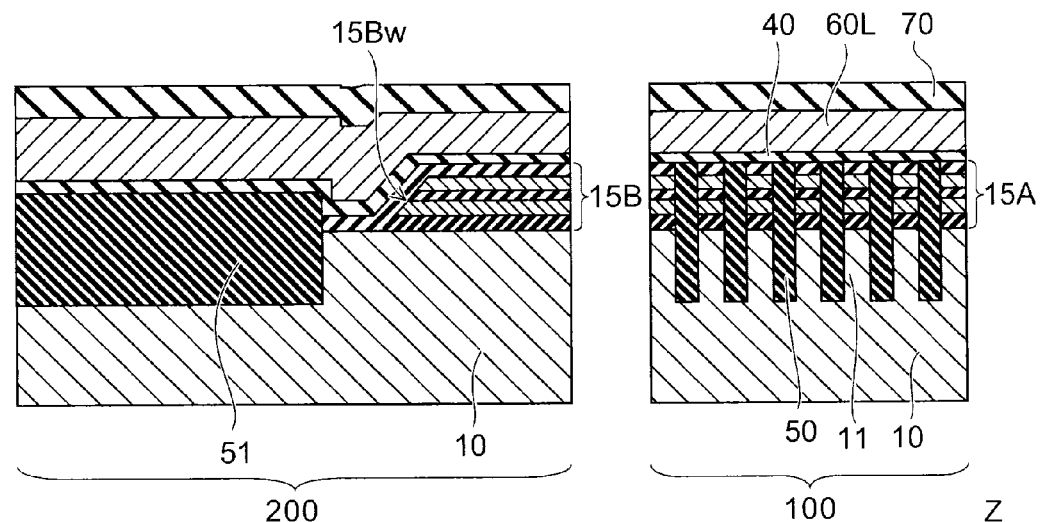

Next, as shown in FIG. 5B, in the memory cell portion 100, the block insulating film 40 is formed on the insulating film 37 and on the element isolation region 50. Further, in the peripheral portion 200, the block insulating film 40 is formed on the insulating film 37 and on the element isolation region 51.

Subsequently, in the memory cell portion 100 and the peripheral portion 200, a control gate electrode layer 60L is formed on the block insulating film 40. Further, the insulating film 70 is formed on the control gate electrode layer 60L.

Next, as shown in FIG. 6A to FIG. 6C, photolithography and RIE are performed to divide the control gate electrode layer 60L in the Y-direction to form the control gate electrode 60 extending in the X-direction.

FIG. 7A to FIG. 7D are schematic cross-sectional views showing a method for manufacturing a nonvolatile semiconductor memory device according to a reference example.

Figure 8A:
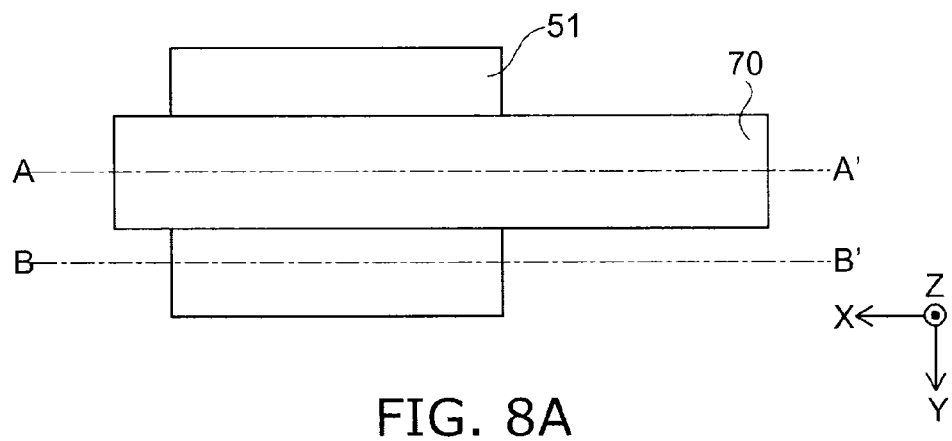
FIG. 8A is a schematic plan view showing the method for manufacturing a nonvolatile semiconductor memory device according to the reference example.
Figure 8B:
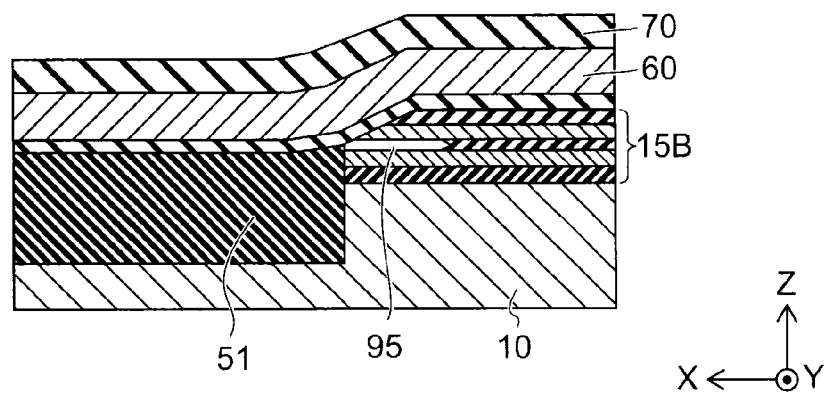
FIGS. 8B and 8C are schematic cross-sectional views showing the method for manufacturing a nonvolatile semiconductor memory device according to the reference example.
Figure 8C:
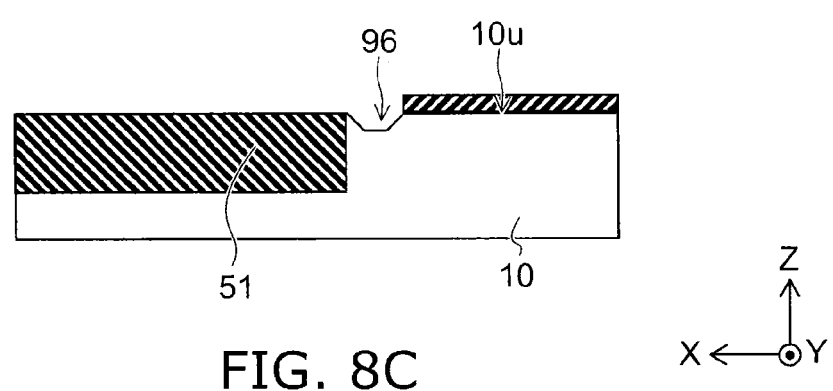

FIG. 8A is a schematic plan view showing the method for manufacturing a nonvolatile semiconductor memory device according to the reference example, and FIGS. 8B and 8C are schematic cross-sectional views showing the method for manufacturing a nonvolatile semiconductor memory device according to the reference example.

FIG. 7A shows a state after the chemical mechanical polishing (CMP) method is performed on the surface of the element isolation layer 52 described above to form the element isolation region 50 in the memory cell portion 100 and the element isolation region 51 in the peripheral portion 200.

In the manufacturing process of the reference example, the manufacturing process shown in FIG. 2B to FIG. 3A described above is not experienced. In other words, the peripheral portion 200 does not experience the process that forms the mask layer 90 exposing part of the stacked body 15, performs etching on the stacked body 15 exposed from the mask layer 90 to expose the semiconductor substrate 10 and the side portion 15Bw of the stacked body 15 from the stacked body 15, and forms the insulating film 37 on the exposed semiconductor substrate 10, on the stacked body 15, and on the side portion 15Bw of the stacked body 15.

Next, as shown in FIG. 7B, in the memory cell portion 100, the surface 50u of the element isolation region 50 is etched back by RIE. Thereby, the height of the surface 50u of the element isolation region 50 becomes the same as the height of the stacked body 15A.

In the peripheral portion 200, since the material of the element isolation region 51 is the same as the material of the element isolation region 50, also the surface 51u of the element isolation region 51 is etched back. By the etchback, in the peripheral portion 200, the surface of the insulating film 35B containing the same material as the stopper film 55 is exposed.

Next, as shown in FIG. 7C, in the memory cell portion 100 and the peripheral portion 200, wet etching is performed to remove the stopper film 55.

Here, both the stopper film 55 and the insulating film 35B contain silicon nitride. Therefore, also the insulating film 35B is etched by the etchant for the stopper film 55. Thereby, a space 95 is formed in a portion of the stacked body 15B where the insulating film 35B has been dissolved away.

Next, as shown in FIG. 7D, in the memory cell portion 100, the block insulating film 40 is formed on the insulating film 37 and on the element isolation region 50. Further, in the peripheral portion 200, the block insulating film 40 is formed on the insulating film 37 and on the element isolation region 51.

Subsequently, in the memory cell portion 100 and the peripheral portion 200, the control gate electrode layer 60L is formed on the block insulating film 40. Further, the insulating film 70 is formed on the control gate electrode layer 60L. After that, as shown in FIG. 8A to FIG. 8C, the control gate electrode layer 60L is processed to form the control gate electrode 60.

If the space 95 is formed like the reference example, the layer 36B, the insulating film 37, etc. on the upper side of the space 95 are likely to peel off. If the peeling of films like this occurs, defects like the following may occur.

For example, an element (e.g. a transistor, a resistance, a capacitor, etc.) disposed near the space 95 may be destroyed. Furthermore, flakes (foreign substances) produced by the peeling of films may fly to the memory cell portion 100 during manufacturing processes and be attached to the memory cell portion 100 as foreign substances. Furthermore, a chemical liquid may remain in the space 95 to corrode the element further. For example, the etching in the space 95 may proceed and erode the surface 10u of the semiconductor substrate 10, and a recess 96 may be formed (FIG. 8C).

In contrast, in the embodiment, when the stopper film 55 is removed by wet etching, the uppermost layer of the stacked body 15B is the insulating film 37 of a material different from the stopper film 55, and the side portion 15Bw of the stacked body 15B is covered with the insulating film 37. Therefore, even if the insulating film 35B contains the same material as the stopper film 55, the insulating film 35B is protected by the insulating film 37 and is not etched. Thus, the space 95 and the recess 96 are not formed. Thereby, the defects mentioned above are suppressed. Consequently, a nonvolatile semiconductor memory device in which the manufacturing yield is high and reliability is high is obtained.

Hereinabove, embodiments are described with reference to specific examples. However, the embodiment is not limited to these specific examples. That is, one skilled in the art may appropriately make design modifications to these specific examples, and such modifications also are included in the scope of the embodiment to the extent that the spirit of the embodiment is included. The components of the specific examples described above and the arrangement, material, conditions, shape, size, etc. thereof are not limited to those illustrated but may be appropriately altered.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
    a semiconductor substrate provided in a memory cell portion and in a peripheral portion at a periphery of the memory cell portion;
    a control gate electrode provided on an upper side of the semiconductor substrate and the control gate electrode extending in a first direction;
    a first element isolation region, a bottom and part of a side portion of the first element isolation region being in contact with the semiconductor substrate, the first element isolation region extending in a second direction crossing the first direction, and the first element isolation region separating a surface layer of the semiconductor substrate into a plurality of semiconductor regions in the memory cell portion;
    a first stacked body, a gate insulating film, a first charge storage layer, a first insulating film, a second charge storage layer, and a second insulating film are stacked in this order from the semiconductor region side in the first stacked body, the first stacked body being positioned in a position, each of the plurality of semiconductor regions and the control gate electrode cross each other in the position in the memory cell portion;
    a second element isolation region, a bottom and at least part of a side portion of the second element isolation region being in contact with the semiconductor substrate in the peripheral portion; and
    a second stacked body, a third insulating film, a first layer, a fourth insulating film, a second layer, and the second insulating film are stacked in this order from the semiconductor substrate side between the semiconductor substrate and the control gate electrode in the second stacked body in the peripheral portion, a side portion of the second stacked body being covered with the second insulating film.

2. The device according to claim 1, wherein the second insulating film extends to the side portion of the second stacked body and up to a surface of the semiconductor substrate between the second stacked body and the second element isolation region and is in contact with the second element isolation region.

3. The device according to claim 1, wherein the third insulating film, the first layer, the fourth insulating film, and the second layer of the second stacked body are not in contact with the second element isolation region.

4. The device according to claim 1, wherein a material of the second insulating film is different from a material of the fourth insulating film.

5. The device according to claim 1, further comprising a fifth insulating film between the second insulating film and the second element isolation region, and the control gate electrode.

6. The device according to claim 1, wherein a material of the third insulating film is the same as a material of the gate insulating film.

7. The device according to claim 1, wherein a material of the first layer is the same as a material of the first charge storage layer.

8. The device according to claim 1, wherein a material of the fourth insulating film is the same as a material of the first insulating film.

9. The device according to claim 1, wherein a material of the second layer is the same as a material of the second charge storage layer.

10. The device according to claim 1, wherein a width of the second element isolation region is wider than a width of the first element isolation region in the first direction.

11. The device according to claim 1, wherein the first direction and the second direction are orthogonal.

12. A method for manufacturing a nonvolatile semiconductor memory device comprising:
 (a) forming a stacked body on a semiconductor substrate, the stacked body including a gate insulating film, a first charge storage layer, a first insulating film, and a second charge storage layer stacked in this order;
 (b) forming a first mask layer, the first mask layer covering the stacked body in a memory cell portion, and the first mask layer exposing part of the stacked body in a peripheral portion at a periphery of the memory cell portion;
 (c) etching the stacked body exposed from the first mask layer to expose the semiconductor substrate in the peripheral portion;
 (d) forming a second insulating film on the stacked body in the memory cell portion and forming the second insulating film on the exposed semiconductor substrate, on the stacked body, and on a side portion of the stacked body in the peripheral portion after removing the first mask layer;
 (e) forming a stopper film on the second insulating film in the memory cell portion and in the peripheral portion;
 (f) forming a second mask layer on the stopper film in the memory cell portion, the second mask layer extending in a second direction, and the second mask layer being aligned in a first direction crossing the second direction, and forming a third mask layer in the peripheral portion, the third mask layer having an opening exposing the stopper film provided on the semiconductor substrate, a side wall of the opening of the third mask layer being located further to an outside of the stacked body than the side portion of the stacked body;
 (g) forming a first trench extending in the second direction and aligned in the first direction in the memory cell portion by etching the stopper film exposed from the second mask layer, the second insulating film under the stopper film, the stacked body under the second insulating film, and the semiconductor substrate under the stacked body and forming a second trench in the peripheral portion by etching the stopper film exposed from the third mask layer, the second insulating film under the stopper film, and the semiconductor substrate under the second insulating film;
 (h) removing the second mask layer and the third mask layer and forming an element isolation layer in the first trench, in the second trench, and on the stopper film;
 (i) lowering a surface of the element isolation layer by a chemical mechanical polishing method in the memory cell portion and in the peripheral portion until the stopper film is exposed, and forming a first element isolation region in the first trench and forming a second element isolation region in the second trench; and
 (j) removing the stopper film in the memory cell portion and in the peripheral portion.

13. The method according to claim 12, further comprising, after the (j) process:
 (k) forming a fifth insulating film on the second insulating film and on the first element isolation region in the memory cell portion and forming the fifth insulating film on the second insulating film and on the second element isolation region in the peripheral portion;
 (l) forming a control gate electrode layer on the fifth insulating film in the memory cell portion and in the peripheral portion; and
 (m) forming a control gate electrode extending in a first direction crossing the second direction by dividing the control gate electrode layer in the second direction.

14. The method according to claim 12, wherein a width of the second trench is formed wider than a width of the first trench in the first direction.

15. The method according to claim 12, wherein a material of the stopper film is different from a material of the second insulating film.

16. The method according to claim 12, wherein in the (j) process, an etching rate of the stopper film in wet etching is higher than an etching rate of the second insulating film when the stopper film is removed by the wet etching.

17. The method according to claim 12, wherein a material of the stopper film and a material of the first insulating film contain the same material.

* * * * *